United States Patent
Lee et al.

(10) Patent No.: US 11,340,304 B2
(45) Date of Patent: May 24, 2022

(54) SYSTEM AND METHOD FOR CHARGING BATTERY

(71) Applicants: HYUNDAI MOTOR COMPANY, Seoul (KR); KIA MOTORS CORPORATION, Seoul (KR)

(72) Inventors: Yoon Jun Lee, Seoul (KR); Byung Jo Jeong, Seoul (KR); Jae Hoon Choi, Gunpo-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 376 days.

(21) Appl. No.: 16/414,966

(22) Filed: May 17, 2019

(65) Prior Publication Data
US 2020/0182942 A1 Jun. 11, 2020

(30) Foreign Application Priority Data
Dec. 11, 2018 (KR) .......................... 10-2018-0158994

(51) Int. Cl.
*G01R 31/392* (2019.01)
*G01R 31/382* (2019.01)
*G01R 31/36* (2020.01)
*H01M 10/42* (2006.01)
*H02J 7/00* (2006.01)
*H01M 10/44* (2006.01)

(52) U.S. Cl.
CPC ....... *G01R 31/392* (2019.01); *G01R 31/3648* (2013.01); *G01R 31/382* (2019.01); *H01M 10/425* (2013.01); *H01M 10/44* (2013.01); *H02J 7/007* (2013.01); *H01M 2220/20* (2013.01)

(58) Field of Classification Search
None
See application file for complete search history.

(56) References Cited

U.S. PATENT DOCUMENTS

| 5,796,239 A | * | 8/1998 | van Phuoc | G01R 31/396 320/107 |
| 2011/0316548 A1 | * | 12/2011 | Ghantous | H01M 10/44 324/427 |

FOREIGN PATENT DOCUMENTS

| KR | 10-2013-0064308 A | 6/2013 |
| KR | 10-2017-0067560 A | 6/2017 |

OTHER PUBLICATIONS

Chen et al. ("Loss-Minimization-Based Charging Strategy for Lithium-Ion Battery," in IEEE Transactions on Industry Applications, vol. 51, No. 5, pp. 4121-4129, Sep.-Oct. 2015) (Year: 2015).*

* cited by examiner

*Primary Examiner* — Roy Y Yi
(74) *Attorney, Agent, or Firm* — Morgan, Lewis & Bockius LLP

(57) ABSTRACT

A method for charging a battery may include: obtaining a state of health of the battery and a magnitude of an initial charging current preset for the battery; converting the magnitude of the initial charging current on the basis of the state of health of the battery, thereby generating a charging current command; and providing the charging current command to a charger, and supplying a charging current corresponding to the charging current command to the battery by the charger.

6 Claims, 3 Drawing Sheets

SYSTEM AND METHOD FOR CHARGING BATTERY

CROSS REFERENCE TO RELATED APPLICATION

The present application claims the benefit of priority to Korean Patent Application No. 10-2018-0158994, filed on Dec. 11, 2018 with the Korean Intellectual Property Office, the entire contents of which is incorporated herein for all purposes by this reference.

TECHNICAL FIELD

The present disclosure relates to a system and method for charging a battery and, more particularly, to a system and method for charging a battery, wherein the system and method are capable of delaying deterioration of a battery by adjusting a magnitude of a battery charging current according to a deterioration state of the battery.

BACKGROUND

As the problems of global warming and environmental pollution become serious, research and development of environmentally friendly vehicles that may reduce environmental pollution as much as possible in the automobile industry are being actively carried out, and the market for environmentally friendly vehicles is also gradually expanding.

As eco-friendly vehicles, an electric vehicle, a hybrid vehicle, and a plug-in hybrid vehicle using electric motors that generate driving force by using electric energy instead of engines that generate driving force by burning conventional fossil fuels are being introduced all over the world. Among the eco-friendly vehicles using the electric energy, the electric vehicle and the plug-in hybrid vehicle charge a battery provided in the vehicle with electric power supplied from external charging facilities connected to a grid and produce the necessary kinetic energy required for driving the vehicle by using power charged in the battery.

Meanwhile, available for the vehicle battery are a boost charge technique that provides DC power directly to the battery, and a slow charge technique that converts AC power into DC power using a battery charger mounted on the vehicle battery, thereby providing the DC power to the battery. In both of the two charging methods, the battery management system provided in the vehicle provides a current command to the charger for charging so that charging is performed in such a manner that the charger supplies the charging current corresponding to the current command provided thereto to the battery.

At this time, the current command provided to the charger is a value appropriately determined in advance taking a capacity and charging time of the battery into consideration. A C-rate is used as a unit for expressing the magnitude of the charging current supplied to or discharging current discharged from the battery. The C-rate is the charging current or discharging current divided by the total capacity of the battery. Conventionally, the magnitude of the charging current is determined according to the C-rate determined in consideration of an initial battery capacity at the time of manufacturing the vehicle.

For example, in the case of a vehicle to which a battery having a capacity of 100 Ah is applied, when the charging current is initially determined to be charged by the boost charge at a rate of 1 C-rate, the magnitude of the charging current becomes 100 A.

However, as a period of use of the battery increases, deterioration of the same progresses, whereby the capacity of the same decreases. When the capacity of a battery with a capacity of 100 Ah decreases to 70% of the initial battery capacity due to deterioration, the C-rate of the boost charge increases to 100/70 (about 1.4).

As described above, conventionally, the magnitude of the charging current is determined in consideration of the initial battery capacity and the magnitude of the charging current determined as above is used regardless of the battery capacity change, so that the C-rate increases continuously as the battery deterioration progresses. Accordingly, the ratio of the charging current to the capacity of the battery increases relatively in magnitude, which increases the current load of the battery, thereby causing the battery deterioration to be further accelerated.

It should be understood that the foregoing description of the background art is merely for the purpose of promoting an understanding of the background of the present disclosure and is not to be construed as admission that this is a conventional art known to those of ordinary skill in the art.

SUMMARY

Accordingly, the present disclosure has been made keeping in mind the above problems occurring in the related art, and the present disclosure is intended to provide a system and method for charging a battery, wherein the system and method are capable of delaying deterioration of a battery by adjusting a magnitude of a battery charging current according to a deterioration state of the battery.

In order to achieve the above object, according to an exemplary embodiment of the present disclosure, a system for charging a battery may include: a battery; a charger for providing the battery with a charging current corresponding to a charging current command that is inputted into the charger; and a controller configured to store a preset magnitude of an initial charging current, convert the preset magnitude of the initial charging current on the basis of a state of health of the battery, thereby generating the charging current command, and provide the charger with the generated charging current command.

In an exemplary embodiment of the present disclosure, the preset magnitude of the initial charging current may be a magnitude of a charging current set to be provided to the battery in a state where deterioration of the battery has not progressed.

In an exemplary embodiment of the present disclosure, the state of health may be a value expressed as a percentage, the value being a ratio of a current capacity of the battery to a capacity of the battery in a state where deterioration of the battery has not progressed.

In an exemplary embodiment of the present disclosure, the controller may be further configured to determine the preset magnitude of the initial charging current being reduced by a magnitude corresponding to the state of health to be the charging current command.

In an exemplary embodiment of the present disclosure, the controller may be further configured to determine the charging current command by an equation, $$I = \frac{SOH}{100} \times A,$$

where I is a magnitude of the charging current command, SOH is the state of health, and A is the initial charging current.

According to another exemplary embodiment of the present disclosure, a method for charging a battery may include steps of:

obtaining a state of health of the battery and a magnitude of an initial charging current preset for the battery;

converting the magnitude of the initial charging current on the basis of the state of health of the battery, thereby generating a charging current command; and providing the charging current command to a charger, and supplying a charging current corresponding to the charging current command to the battery by the charger.

In an exemplary embodiment of the present disclosure, the magnitude of the initial charging current may be a magnitude of a charging current set to be provided to the battery in a state where deterioration of the battery has not progressed.

In an exemplary embodiment of the present disclosure, the state of health is a value expressed as a percentage, the value being a ratio of a current capacity of the battery to a capacity of the battery in a state where deterioration of the battery has not progressed.

In an exemplary embodiment of the present disclosure, the step of supplying the charging current may determine the magnitude of the initial charging current reduced by a magnitude corresponding to an amount of the state of health as the charging current command.

In an exemplary embodiment of the present disclosure, the step of supplying the charging current determines the charging current command by an equation, $$I = \frac{SOH}{100} \times A,$$

where I is a magnitude of the charging current command, SOH is the state of health, and A is the initial charging current.

According to the system and method for charging the battery, it is possible to appropriately reduce the magnitude of the charging current provided by the battery in consideration of the decrease in capacity because of deterioration arising from aging of the battery, thereby preventing the battery charging current load from being increased.

Accordingly, according to the system and method for charging the battery, it is possible to prevent the battery deterioration from being rapidly increased because of an increase in the battery charging current load and to increase the operable service life of the battery.

BRIEF DESCRIPTION OF THE DRAWINGS

The above and other objects, features and other advantages of the present disclosure will be more clearly understood from the following detailed description when taken in conjunction with the accompanying drawings, in which.

Figure 1:
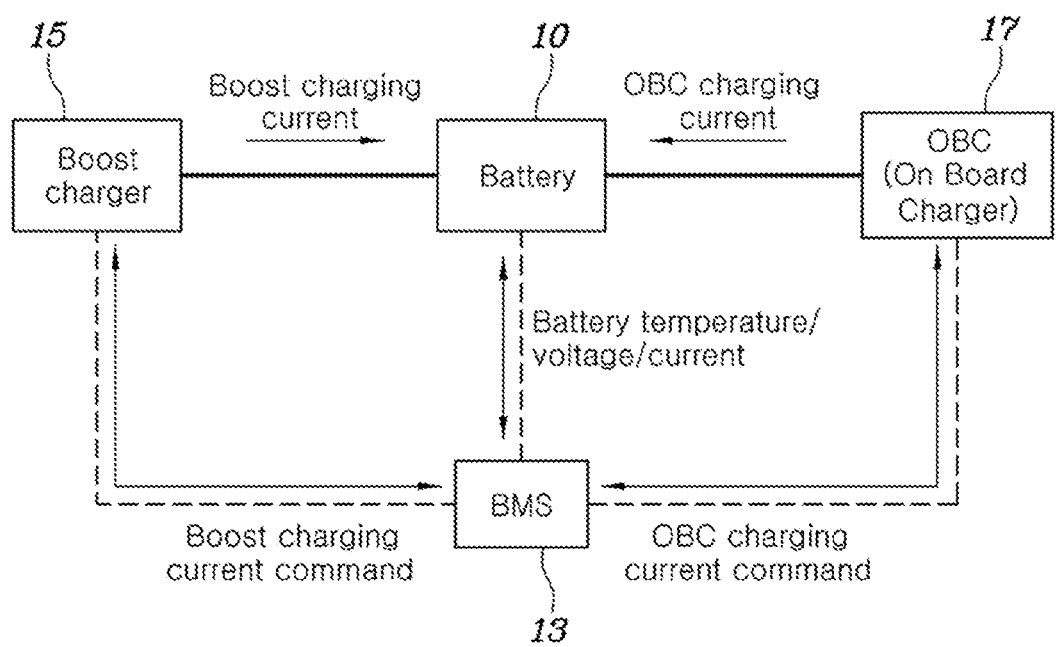
FIG. 1 is a block diagram of a system for charging a battery according to an exemplary embodiment of the present disclosure.

It may be understood that the appended drawings are not necessarily to scale, presenting a somewhat simplified representation of various features illustrative of the basic principles of the disclosure. The specific design features of the present disclosure as disclosed herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure, examples of which are illustrated in the accompanying drawings and described below. While the inventive concept(s) will be described in conjunction with exemplary embodiments of the present disclosure, it will be understood that the present description is not intended to limit the inventive concept(s) to those exemplary embodiments. On the other hand, the inventive concept(s) is/are intended to cover not only the exemplary embodiments of the present disclosure, but also various alternatives, modifications, equivalents and other embodiments, which may be included within the spirit and scope of the inventive concept(s) as defined by the appended claims.

FIG. 1 is a block diagram of a system for charging a battery according to an exemplary embodiment of the present disclosure.

The system for charging a battery according to an exemplary embodiment of the present disclosure may be configured to include: a battery 10; chargers 15 and 17 generating a charging current corresponding to a charging current command input thereinto, thereby providing the charging current to the battery 10; and a controller 13 storing a preset magnitude of an initial charging current, converting the magnitude of an initial charging current on the basis of a state of health (SOH) of the battery 10, thereby generating the charging current command, and providing the generated charging current command to the chargers 15 and 17.

The battery 10 is a device storing electric energy. In the case of the electric vehicle or plug-in hybrid vehicle, the battery 10 may be a battery that supplies power to a motor that provides torque to drive wheels of the vehicle. Meanwhile, the battery 10 may be charged by the charging current provided by the chargers 15 and 17.

When charging is requested, the chargers 15 and 17 may supply the charging current to the battery 10. The chargers 15 and 17 may include a boost charger 15 that may supply DC power directly to the charging plug of the vehicle, thereby allowing the battery 10 to be rapidly charged, and an vehicle on board charger (OBC) 17 that is mounted on the vehicle and may convert AC power input to the charging plug of the vehicle into DC power and supply the DC power to the battery 10, thereby allowing the battery 10 to be charged.

Both of the boost chargers 15 and the vehicle OBC 17 may be provided with charging current commands from the controller 13 respectively and controlled through processors or the like thereinside so as to output currents corresponding to the charging current command respectively.

The controller 13 may provide the charging current command to the boost charger 15 and the vehicle OBC 17. In the case of the electric vehicle or plug-in hybrid vehicle, an in-vehicle battery management system (BMS) may be included for managing the maintenance and charging of the battery 10. In an exemplary embodiment of the present disclosure, the controller 13 may be the in-vehicle BMS.

The controller 13 may be provided with battery information such as temperature, voltage, a current, and the like of the battery 10 and may generate various information necessary for battery management accordingly. For example, the controller 13 may calculate a state of charge (SOC) of the battery 10 or calculate or derive the SOH of the battery 10 using the battery information. In addition, the controller 13 may include information on the initial charging current of the battery 10 in a memory (not shown) provided therein.

The initial charging current has a predetermined magnitude when the battery 10 is in an initial state where the deterioration of the battery 10 has not progressed.

The controller 13 may include at least one memory and at least one processor programmed to perform the functions described above.

In an exemplary embodiment of the present disclosure, the controller 13 may generate the charging current command provided to the chargers 15 and 17 on the basis of the SOH of the battery 10 and the magnitude of the initial charging current.

Figure 2:
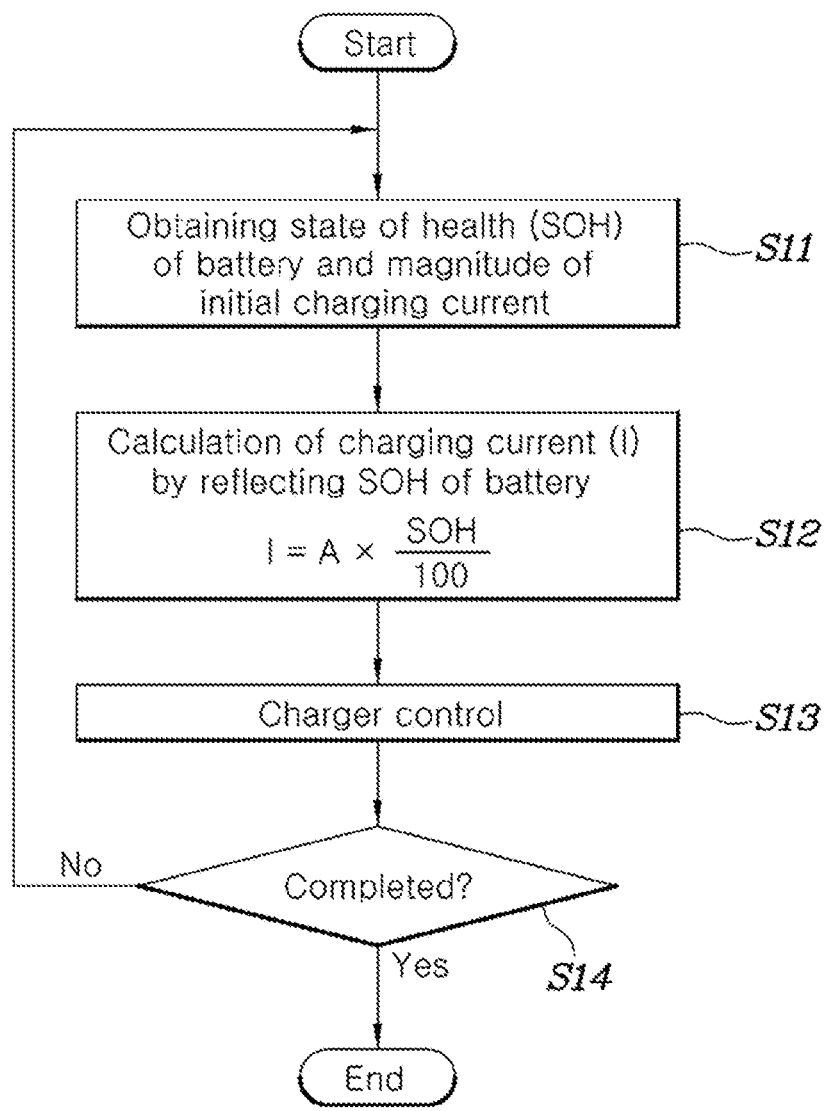
FIG. 2 is a flowchart of a method for charging a battery according to an exemplary embodiment of the present disclosure.

FIG. 2 is a flowchart of a method for charging a battery according to an exemplary embodiment of the present disclosure. The method for charging the battery according to an exemplary embodiment of the present disclosure is implemented by the system for charging the battery according to an exemplary embodiment of the present disclosure described above. Therefore, an operation and effect of the system for charging the battery according to the exemplary embodiment of the present disclosure may be more clearly explained through the detailed description of the method for charging the battery according to an exemplary embodiment of the present disclosure.

With reference to FIG. 2, the method for charging the battery according to an exemplary embodiment of the present disclosure may be configured to include: step S11 of obtaining the SOH of the battery 10 and a magnitude of an initial charging current preset for the battery 10 by the controller 13; step S12 of converting, by the controller 13, the magnitude of the initial charging current on the basis of the SOH of the battery 10, thereby generating a charging current command; and step S13 of providing the charging current command to a chargers 15 and 17 providing a charging current to the battery 10, and supplying the charging current corresponding to the charging current command to the battery 10 by the chargers 15 and 17.

In step S11, the controller 13 may obtain the SOH of the battery 10 and the magnitude of the initial charge current.

A degree of deterioration of the battery is a factor indicating the service life of the battery and also called as the SOH. The SOH of the battery may be expressed as a percentage calculated by taking the total capacity of the battery as a denominator in the initial state where the deterioration of the battery has not progressed and the total capacity of the battery in the present state as a numerator. For example, 70% of the SOH of the battery means that the capacity of the battery has decreased to a 70% level of the capacity of the battery at the initial stage when the deterioration has not progressed.

Techniques for deriving the SOH of the battery are already well known in the art. For example, the SOH of the battery may be determined by a method in which information on a battery state such as the temperature, current, and voltage of the battery is collected, whereby the battery state is calculated by applying information on the battery state to a preset calculation formula of the SOH of the battery, or, by using the preset data map, the SOH of the battery matched in advance with the information on the state is found.

The initial charging current is a predetermined value so that the battery 10 may meet the preset C-rate at a state where the battery 10 is not deteriorated immediately after completion of charging and before use thereof. For example, when the initial capacity before the deterioration of the battery is 100 Ah and the C-rate determined by taking charging time into consideration is 1, the predetermined magnitude of the charging current becomes 100 A. Naturally, the charging current may be gradually decreased as the SOC increases while the battery 10 is charged. The charging current to be reduced may also be set in advance. The preset magnitude of the initial charging current may be stored in a memory (not shown) or the like in the controller 13 and read and used as needed.

As the period of use of the battery 10 increases, the deterioration of the battery 10 progresses, and the capacity of the battery 10 gradually decreases accordingly. Providing a charging current that is initially set to a battery of which capacity is reduced results in a relative increase in the current load of the battery, which causes the battery to be overloaded, thereby increasing a deterioration speed of the battery.

An exemplary embodiment of the present disclosure, in step S12, the controller 13 may convert the initial charging current command taking the battery 10 of which capacity is reduced into consideration and provide the converted charging current command to the chargers 15 and 17. In step S12, the controller 13 may determine the magnitude A of the initial charging current being reduced by a magnitude A corresponding to the SOH as the magnitude A of the charging current of the battery 10 that has undergone deterioration. For example, the controller 13 may determine the magnitude A of the charging current of the battery 10 that has undergone deterioration, by reflecting the SOH as shown in the following equation.

$$I = \frac{SOH}{100} \times A \qquad \text{[Equation]}$$

For example, when the SOH of the battery 10 is 70, and the preset initial charge current is 100 A, the magnitude of charging current of the battery 10 that has undergone deterioration may be determined as '100*70/100=70 A'.

In step S13, the controller 13 may provide the magnitude of the charging current of the battery 10 that has undergone deterioration to the chargers 15 and 17 as a current command and control chargers, through a processor and the like provided in each charger, to allow the magnitude of the output current of the controller 13, that is, the charging current supplied to the battery 10, to be adjusted to a magnitude corresponding to the current command, whereby the charging current reduced by taking the SOH into consideration may be supplied to the battery 10.

The current control method of each of the chargers 15 and is a known technique for each charger, so a detailed description thereof will be omitted.

The above-described steps S11 to S13 may be repeated at predetermined time intervals until set charging time or a set target SOC is satisfied, and when the set charging time has elapsed or the set target SOC is attained, the controller 13 may stop the operation of the chargers 15 and 17, whereby the charging operation may be completed in step S14.

Figure 3:
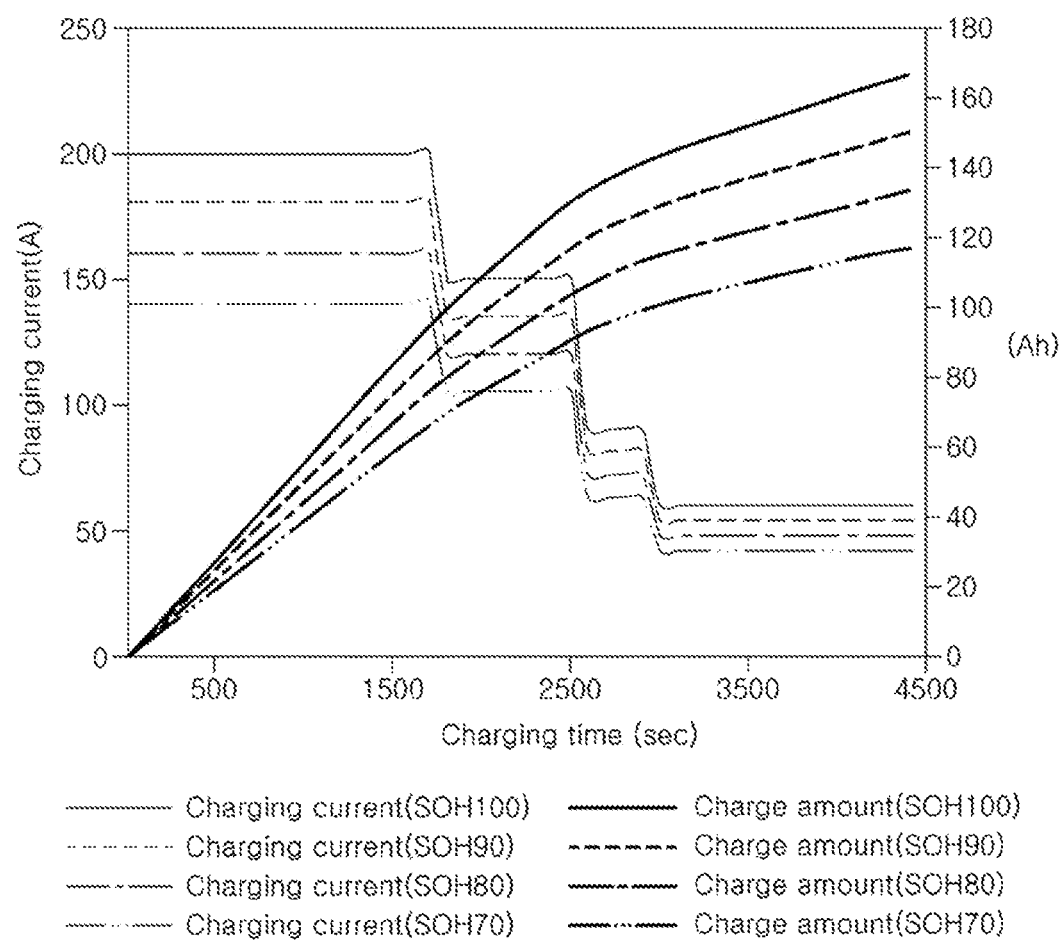
FIG. 3 is a graph showing changes in magnitudes of charging currents when a system and method for charging a battery according to an exemplary embodiment of the present disclosure is applied.

FIG. 3 is a graph showing changes in magnitudes of charging currents when a system and method for charging a battery according to an exemplary embodiment of the present disclosure is applied. The charging method shown in FIG. 3 is an example of a step charging method charging by gradually reducing the charging current with time.

As shown in FIG. 3, in a state where the SOH of the battery 10 is 100, that is, in the state where the deterioration has not progressed, the charging is performed with the charging current reduced stage by stage from 200 A as time elapses and is performed up to about 170 Ah at which the SOC becomes 100.

However, when the SOH of the battery is 90, the magnitude of the charging current is reduced to about 9/10 as compared with the same when the SOH of the battery is 100, and the final charging amount is also about 150 Ah which is a 9/10 level of 170 Ah. Also, when the SOHs of the battery are 80 and 70, respectively, it may be confirmed that the magnitudes of the charging currents and the final charge amounts are reduced to follow corresponding rates, respectively.

As described above, by reducing the magnitude of the charging current for the battery taking the SOH of the battery into consideration according to various embodiments of the present disclosure, it is possible to prevent the increase of the current load of the battery because of the decrease of the battery capacity due to deterioration of the battery. Accordingly, it is possible to prevent a deterioration speed of the battery from being accelerated, thereby increasing the service life of the battery.

While the inventive concept(s) has/have been shown and described with respect to the specific embodiments thereof, it will be apparent to those skilled in the art that various modifications and variations may be made in the present disclosure within the scope of the claims below.

What is claimed is:

1. A system for charging a battery, the system comprising:
    a battery;
    a charger for providing the battery with a charging current corresponding to a charging current command that is inputted into the charger; and
    a controller configured to store a preset magnitude of an initial charging current, convert the preset magnitude of the initial charging current on the basis of a state of health of the battery, thereby generating the charging current command, and provide the charger with the generated charging current command,
    wherein the preset magnitude of the initial charging current is a magnitude of a charging current set to be provided to the battery in a state where deterioration of the battery has not progressed, and
    wherein the controller is further configured to determine the charging current command by an equation, $I=SOH/100*A$, where I is a magnitude of the charging current command, SOH is the state of health, and A is the initial charging current.

2. The system of claim 1, wherein the state of health is a value expressed as a percentage, the value being a ratio of a current capacity of the battery to a capacity of the battery in a state where deterioration of the battery has not progressed.

3. The system of claim 1, wherein the controller is further configured to determine the preset magnitude of the initial charging current being reduced by a magnitude corresponding to the state of health to be the charging current command.

4. A method for charging a battery, the method comprising steps of:
    obtaining a state of health of the battery and a magnitude of an initial charging current preset for the battery;
    converting the magnitude of the initial charging current on the basis of the state of health of the battery, thereby generating a charging current command; and
    providing the charging current command to a charger, and supplying a charging current corresponding to the charging current command to the battery by the charger,
    wherein the magnitude of the initial charging current is a magnitude of a charging current set to be provided to the battery in a state where deterioration of the battery has not progressed, and
    wherein in the step of supplying the charging current, the charging current command is determined by an equation, $I=SOH/100*A$, where I is a magnitude of the charging current command, SOH is the state of health, and A is the initial charging current.

5. The method of claim 4, wherein the state of health is a value expressed as a percentage, the value being a ratio of a current capacity of the battery to a capacity of the battery in a state where deterioration of the battery has not progressed.

6. The method of claim 4, wherein in the step of supplying the charging current, the magnitude of the initial charging current reduced by a magnitude corresponding to an amount of the state of health is determined to be the charging current command.

* * * * *